United States Patent
Kim

(10) Patent No.: US 7,264,995 B2
(45) Date of Patent: Sep. 4, 2007

(54) METHOD FOR MANUFACTURING WAFER LEVEL CHIP SCALE PACKAGE USING REDISTRIBUTION SUBSTRATE

(75) Inventor: Jae-June Kim, Kyoungki-do (KR)

(73) Assignee: Epworks Co., Ltd., Seoul (KR)

( * ) Notice: Subject to any disclaimer, the term of this patent is extended or adjusted under 35 U.S.C. 154(b) by 146 days.

(21) Appl. No.: 11/245,962

(22) Filed: Oct. 7, 2005

(65) Prior Publication Data
US 2006/0079019 A1   Apr. 13, 2006

(30) Foreign Application Priority Data
Oct. 8, 2004  (KR) .......................... 2004-0080155

(51) Int. Cl.
*H01L 21/44* (2006.01)
(52) U.S. Cl. .................................... 438/106
(58) Field of Classification Search ............ 438/6, 438/10, 104–114, 121–123, 128–129, 135, 438/142, 145, 149, 151, 157, 176, 478
See application file for complete search history.

(56) References Cited

U.S. PATENT DOCUMENTS

| | | |
|---|---|---|
| 2003/0113979 A1* | 6/2003 | Bieck et al. ................ 438/411 |
| 2005/0059188 A1* | 3/2005 | Bolken et al. ............. 438/106 |
| 2005/0104179 A1* | 5/2005 | Zilber et al. ............... 257/684 |

\* cited by examiner

*Primary Examiner*—Michael Lebentritt
*Assistant Examiner*—Andre Stevenson
(74) *Attorney, Agent, or Firm*—IPLA P.A.; James E. Bame

(57) ABSTRACT

The present invention provides a method for manufacturing a wafer level chip scale package using a redistribution substrate, which has patterned bump pairs connected by redistribution lines and formed on a transparent insulating substrate. The redistribution substrate is produced separately from a wafer and then bonded to the wafer. One part of each bump pair is in contact with a chip pad on the active surface of the wafer, and the other part coincides with one of holes formed in the wafer. Conductive lines are formed in the holes and on the non-active surface of the wafer. External connection terminals are formed on the conductive lines at the non-active surface.

24 Claims, 30 Drawing Sheets

METHOD FOR MANUFACTURING WAFER LEVEL CHIP SCALE PACKAGE USING REDISTRIBUTION SUBSTRATE

CLAIM OF PRIORITY

This application claims priority from Republic of Korea Patent Application No. 2004-0080155 filed 8 Oct. 2004 to the same inventor.

BACKGROUND OF THE INVENTION

1. Field of the Invention

The present invention relates generally to semiconductor packaging technology and, more particularly, to a method for manufacturing a wafer level chip scale package (WL-CSP).

2. Description of the Related Art

As well known in the art, a great number of integrated circuit (IC) devices are fabricated in a semiconductor wafer and divided into individual chips. The chips are then separated from the wafer and assembled in the package form to be used for electronic systems or products. A package provides in general a structure to mechanically support the chip, a physical housing to protect the chip from the environment, electrical connections to and from the chip, and paths of removing heat generated by the chip.

Recently the rapid growth of multimedia, information, communication, and digital related industries requires new and advanced IC products with small form factor, high integration, and high performance. Such currents of the market are reflected in reduced chip size, increased electrical terminals, and so forth, which result in many new challenges to structural and electrical design of the package rather than of the chip. The packaging technology of today is so getting more important as to affect the price, performance, and reliability of electronic end-applications.

A widely known, initial form of the package has used a lead frame that has lead terminals peripherally arranged at edges of the chip. Thereafter, a ball grid array (BGA) package using solder balls area-distributed over a printed circuit board has been developed to offer a greater number of terminals, and further, a chip scale package (CSP) has been developed to satisfy the industry's growing demand for the smallest, i.e., chip-sized, form factor. Additionally, a wafer level package (WLP) technology has been introduced to realize cost-effective fabrication of packages on the wafer prior to chip separation.

A conventional WLP and its fabrication are shown in FIGS. 1A to 1K. The illustrated, conventional WLP has been well known as 'ShellBGA' developed by Shellcase, Ltd., Israel.

FIG. 1A shows a silicon wafer 1 in which a number of IC chips 10a and 10b are formed. A scribe region 13 divides the adjacent chip 10a and 10b. Each chip 10a, 10b has a plurality of chip pads 12 on its active surface 11. Except for the chip pads 12, the active surface 11 is covered with a passivation layer 16. A pad extension layer 14 is connected with and extended from the chip pads 12.

FIG. 1B shows a step of attaching a first glass substrate 20 to the silicon wafer 1. For attachment between them, an epoxy 18 is coated on the passivation layer 16 and the pad extension layer 14.

FIG. 1C shows a step of forming ball pads 22 on the first glass substrate 20. The ball pads 22 are locations where solder balls will be formed as external connection terminals of the package.

FIG. 1D shows a step of forming a notch 24 by partially removing the wafer 1 from the first glass substrate 20 to upper parts of the chip 10a and 10b along the scribe region 13. As a result, a side end of the pad extension layer 14 is exposed to the notch 24.

FIG. 1E shows a step of forming a patterned lead layer 26, which is arranged from a surface of the notch 24 and to the ball pad 22. The lead layer 26 is therefore connected to the pad extension layer 14 exposed to the notch 24.

FIG. 1F shows a step of forming a solder mask layer 30, which covers most parts of the lead layer 26 except for parts on the ball pads 22.

FIG. 1G shows a step of forming solder balls 32 on the respective ball pads 22. The lead layer 26 on the ball pads 22 is therefore electrically coupled to the solder balls 32.

FIG. 1H shows a wafer back-grinding step. In this step lower parts of the wafer 1 are mechanically grinded, so each chip 10a and 10b is reduced in thickness.

FIG. 1I shows a step of etching away the wafer 1 along the scribe region 13 from the back surface of the wafer 1.

FIG. 1J shows a step of attaching a second glass substrate 34 to the back surface of the wafer 1 through an epoxy 36.

FIG. 1K shows a wafer-dicing step. In this step the wafer 1 is divided along a dicing region 38 within the scribe region 13, so the WLPs fabricated on the respective chips 10a and 10b are obtained.

As discussed hereinbefore, the conventional WLP employs the notch formed along the scribe region to allow forming the patterned lead layer through the notch. Accordingly, in order to form the notch, the conventional WLP needs an increase in width of the scribe region than the dicing region. Unfortunately, this may cause a decrease in chip count in a single wafer.

Additionally, since the patterned lead layer is formed on the exterior of the chip, the conventional WLP may reach the limits of a reduction in package size. Moreover, the patterned lead layer directly running on the chip edges only may restrict the pattern design flexibility.

SUMMARY OF THE INVENTION

Exemplary, non-limiting embodiments of the present invention provide a method for manufacturing a wafer level chip scale package without increasing the width of a scribe region in a wafer. Exemplary, non-limiting embodiments of the present invention further provide a method for manufacturing a wafer level chip scale package not only being favorable for a reduction in package size, but also having excellent pattern design flexibility.

According to one exemplary embodiment of the present invention, the method comprises (a) producing a redistribution substrate having a transparent insulating substrate and redistribution lines formed on the transparent insulating substrate; (b) providing a wafer having a semiconductor substrate having an active surface and at least one non-active surface, the wafer further having chip pads formed on the active surface; (c) bonding the redistribution substrate to the wafer so that first parts of the redistribution lines are connected with the chip pads; (d) forming holes extended from the active surface to the non-active surface in the wafer so that the second parts of the redistribution lines are exposed to the holes; (e) forming conductive lines in the holes and on the non-active surface; (f) forming external connection terminals on the conductive lines formed on the non-active surface; and (g) dividing both the redistribution substrate and the wafer along a scribe line.

In the method of the present invention, the (a) step may include (a-1) providing the transparent insulating substrate; (a-2) providing an insulating layer on the transparent insulating substrate; (a-3) forming bumps by patterning the insulating layer; and (a-4) forming the redistribution lines on the bumps.

The transparent insulating substrate may be made of glass, quartz, or acrylic resin. The (a-3) step may further have forming dams by patterning the insulating layer. Also, the (a-3) step may be forming pairs of bumps, each pair having a first bump connected with the chip pad and a second bump exposed to the hole. The insulating layer may be made of polymer.

The redistribution lines may be made of copper (Cu), nickel (Ni), titanium (Ti), chromium (Cr), tungsten (W), or their compositions. The (a-4) step may be implemented using sputtering, electroplating, deposition, electroless plating, screen printing, or ink printing.

The wafer may further have an image sensing area formed on the active surface. In addition, the wafer may further have at least one pad metal layer formed on the chip pads. The pad metal layer may be made of gold (Au), nickel (Ni), aluminum (Al), copper (Cu), tin (Sn), or their compositions.

The bonding between the redistribution substrate and the wafer in the (c) step may be established using a photosensitive adhesive. The connection between the redistribution lines and the chip pads in the (c) step may be made using an indium (In)-based adhesive. Alternatively, the bonding between the redistribution substrate and the wafer in the (c) step may be made using anisotropic conductive material or nano interconnection paste.

The method of the invention may further comprise, after the (c) step, mechanically grinding a bottom surface of the wafer so as to reduce the thickness of the wafer. The wafer may be thinned down to the thickness of about 50~150 μm by the grinding step.

The (d) step may be implemented using laser drilling, mechanical drilling, plasma dry etching, or reactive ion etching.

The (e) step may include forming at least one conductive layer in the holes and on the non-active surface, and selectively removing the conductive layer so as to create the conductive lines. Alternatively, the (e) step may include forming a photoresist pattern corresponding to the conductive lines on the non-active surface, and performing a selective electroplating through the photoresist pattern so as to create the conductive lines.

The conductive lines may have first conductive lines and second conductive lines formed on the first conductive lines. The first conductive lines may be formed of tungsten (W), titanium (Ti), aluminum (Al), zirconium (Zr), chromium (Cr), copper (Cu), gold (Au), silver (Ag), lead (Pb), nickel (Ni), indium tin oxide (ITO), or their compositions. The second conductive lines may be formed of one composition selected among chromium (Cr), titanium (Ti), tungsten (W), copper (Cu), nickel (Ni), gold (Au), and titanium tungsten (TiW).

The method of the invention may further comprise, after the (e) step, forming a dielectric protective layer on the conductive lines so as to protect the conductive lines and to define terminal locations.

The external connection terminals in the (f) step may be formed on a bottom surface of the semiconductor substrate, or otherwise on at least one lateral side surface of the semiconductor substrate.

DETAILED DESCRIPTION OF EXEMPLARY EMBODIMENTS OF THE INVENTION

Figure 1A:
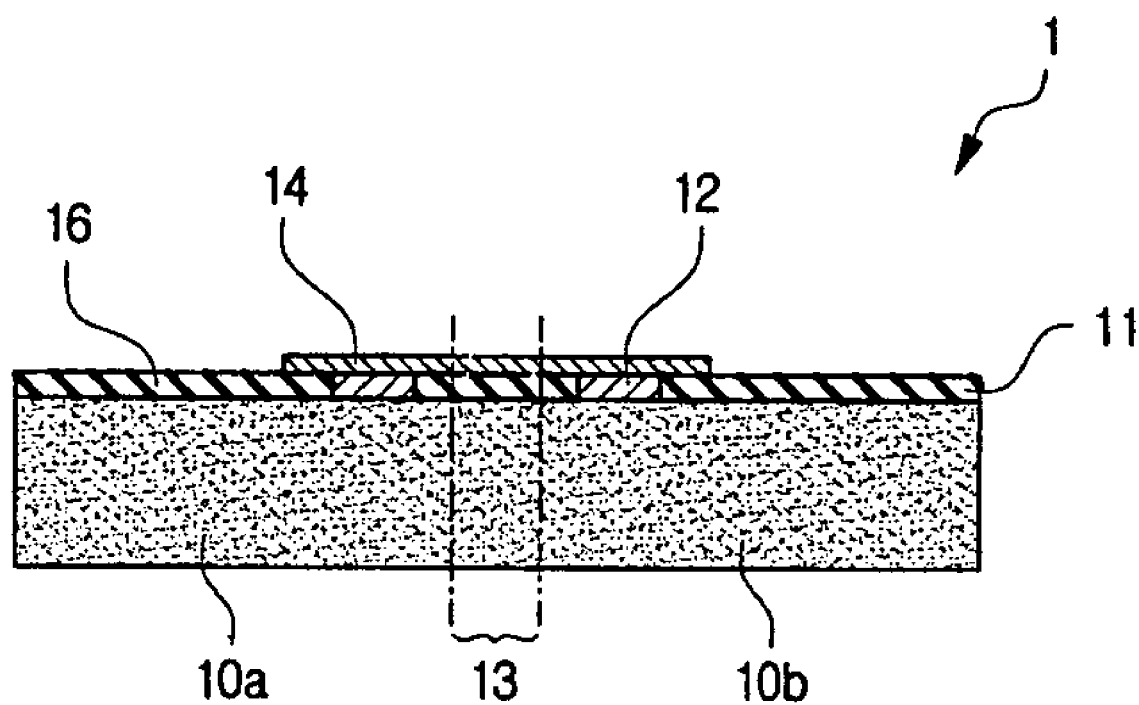
FIGS. 1A to 1K are cross-sectional views showing a method for fabricating a conventional wafer level package.
Figure 1B:
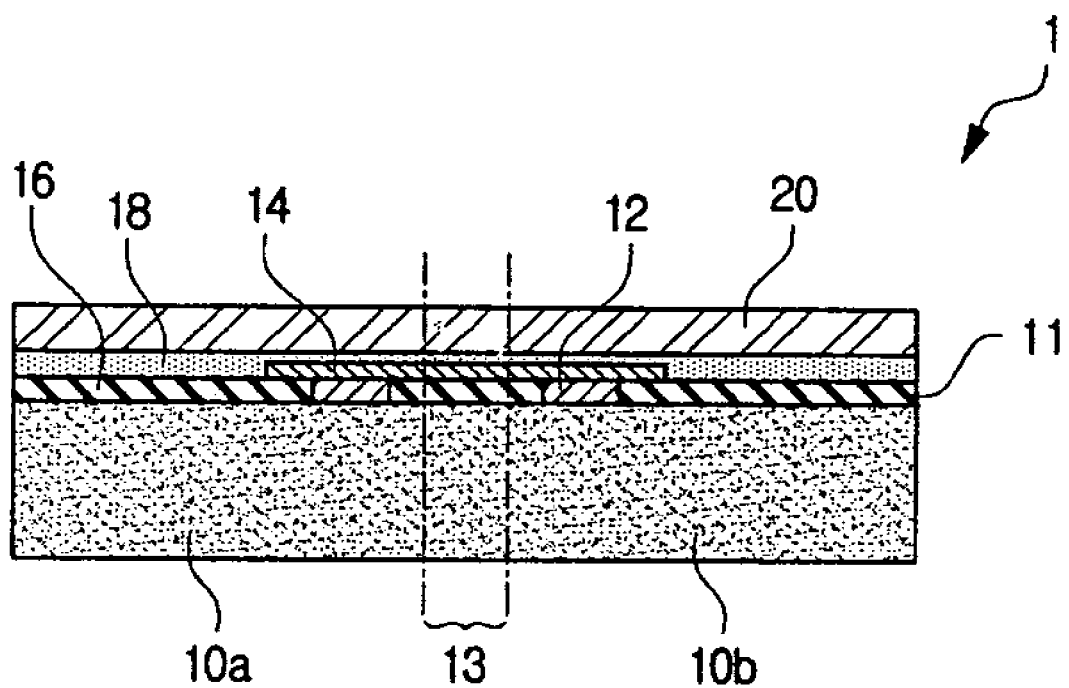
Figure 1C:
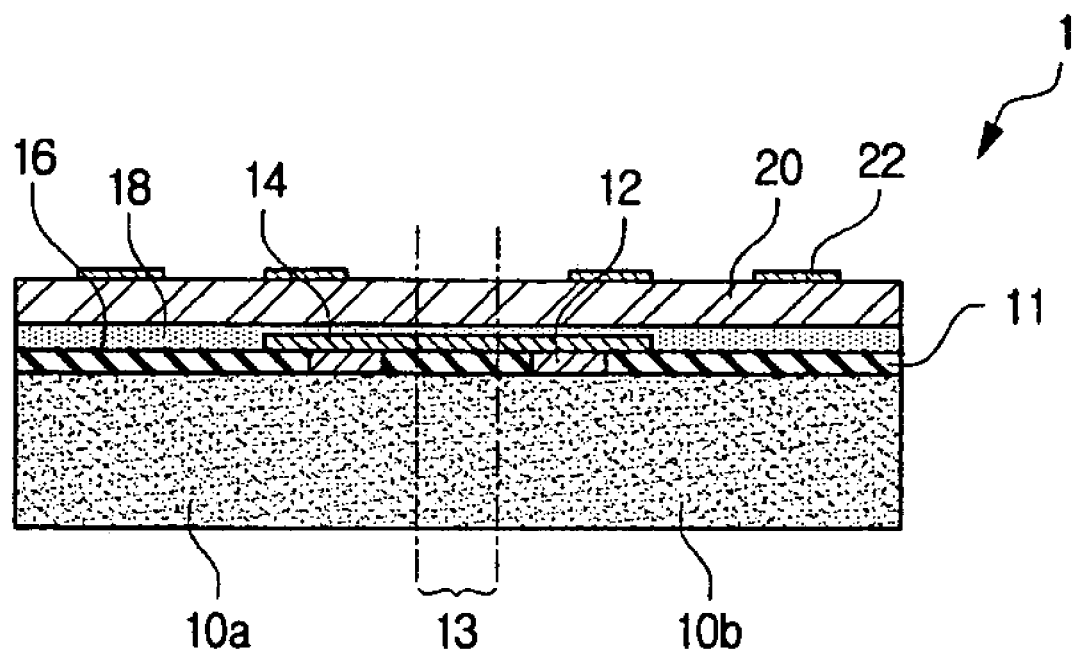
Figure 1D:
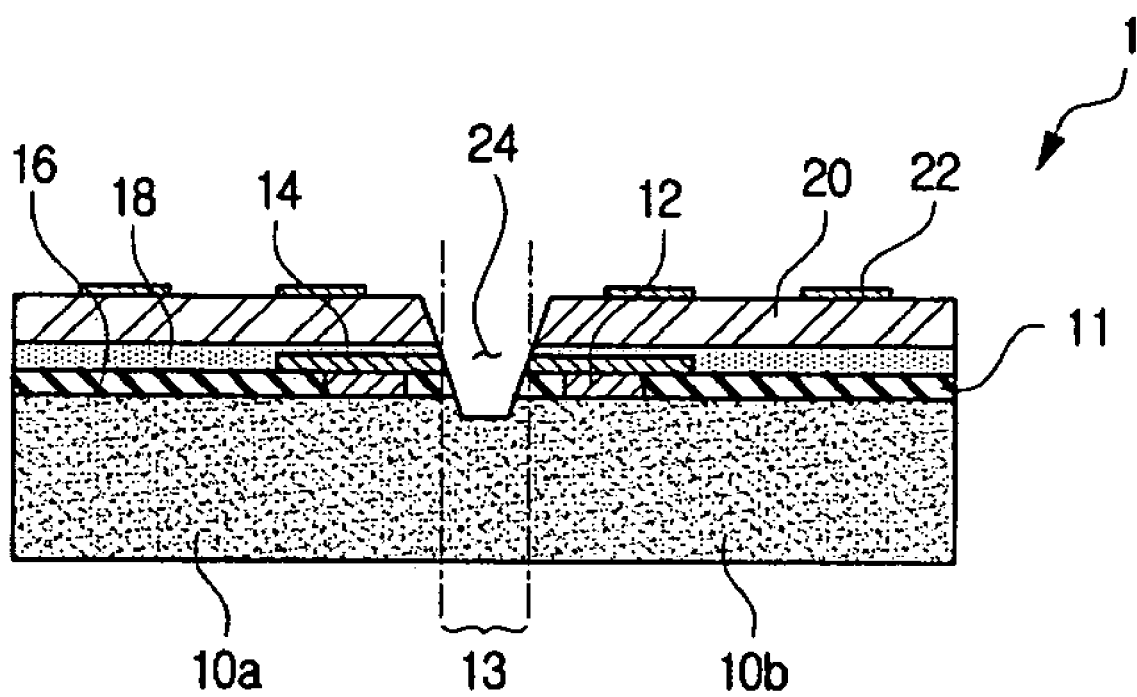
Figure 1E:
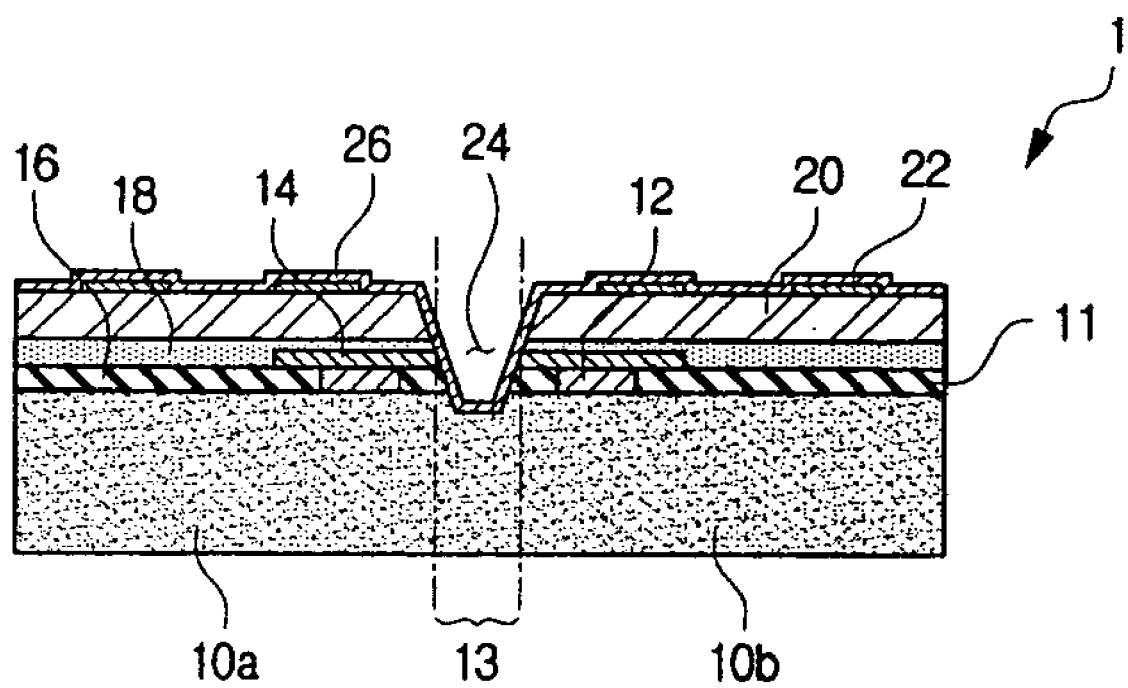
Figure 1F:
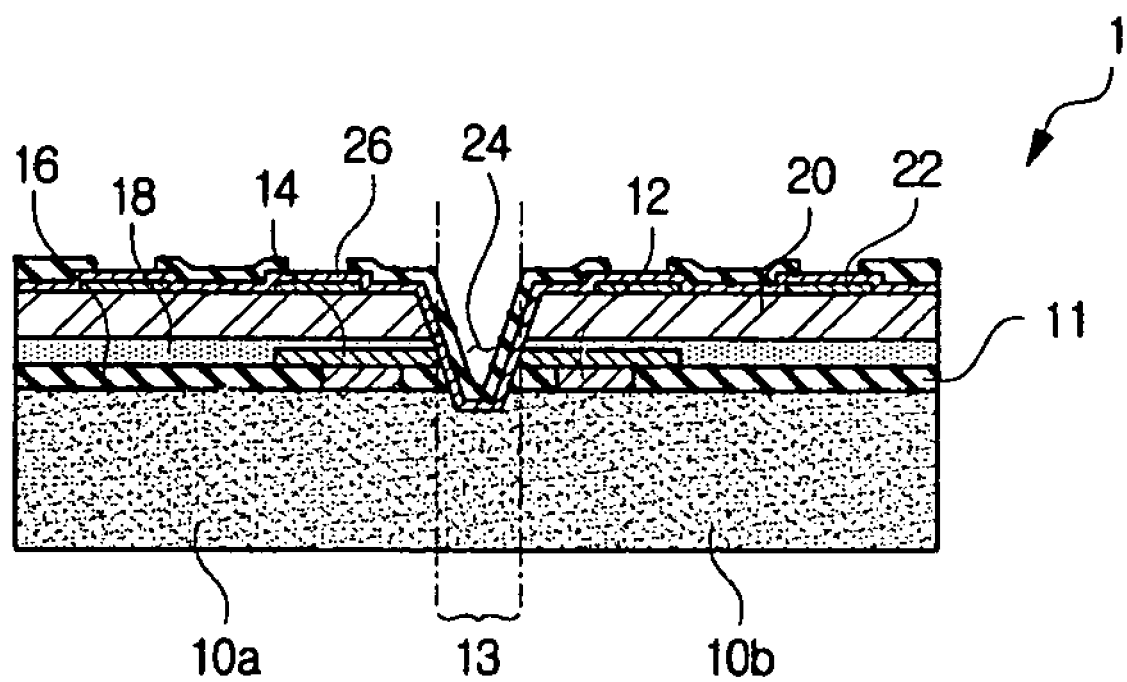
Figure 1G:
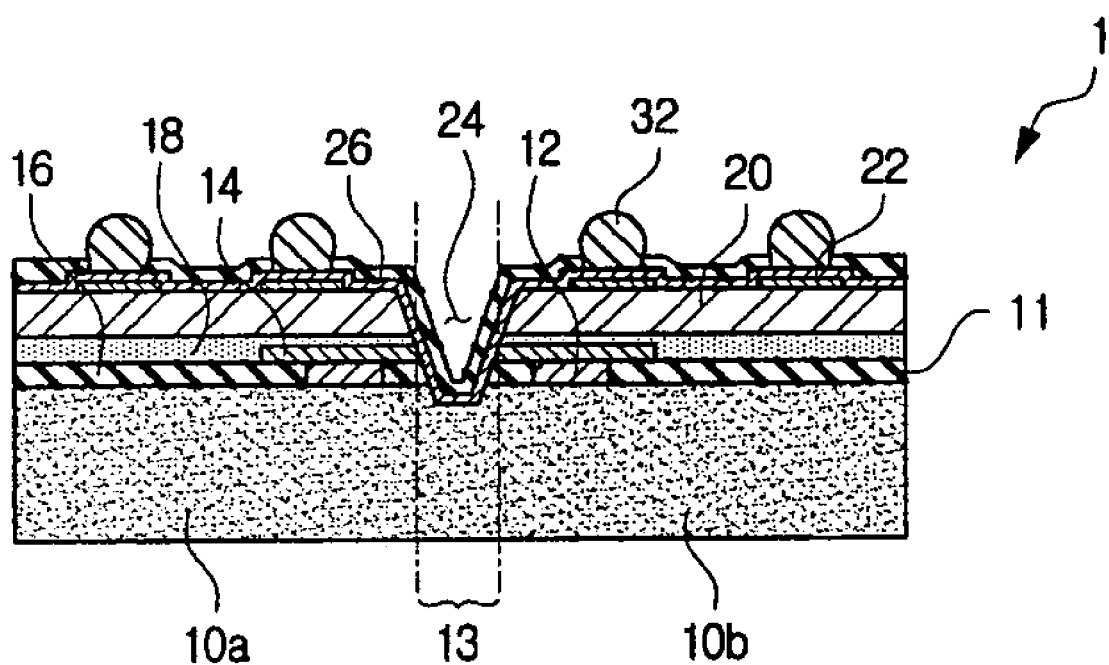
Figure 1H:
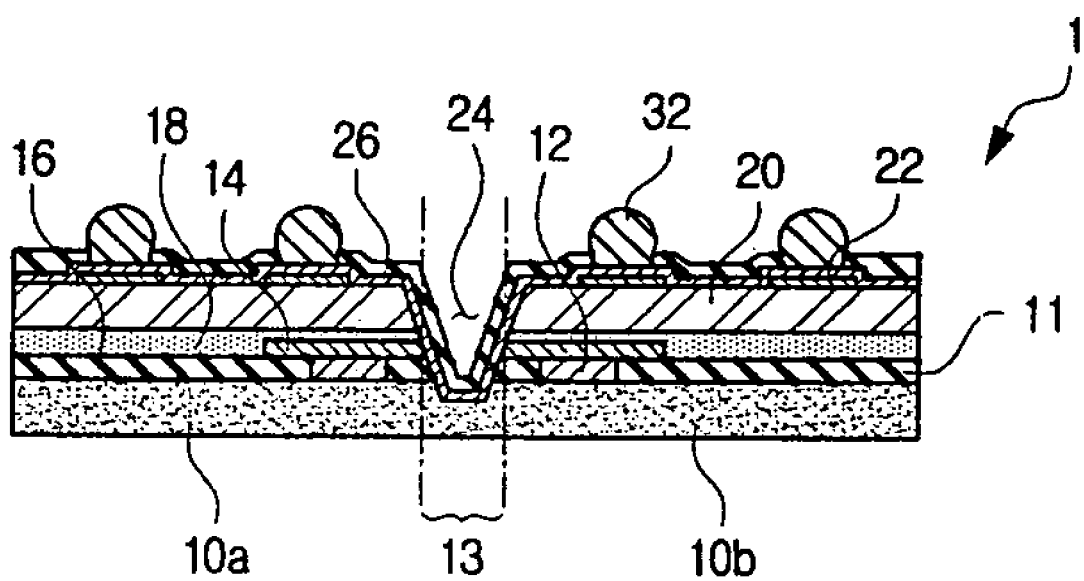
Figure 1I:
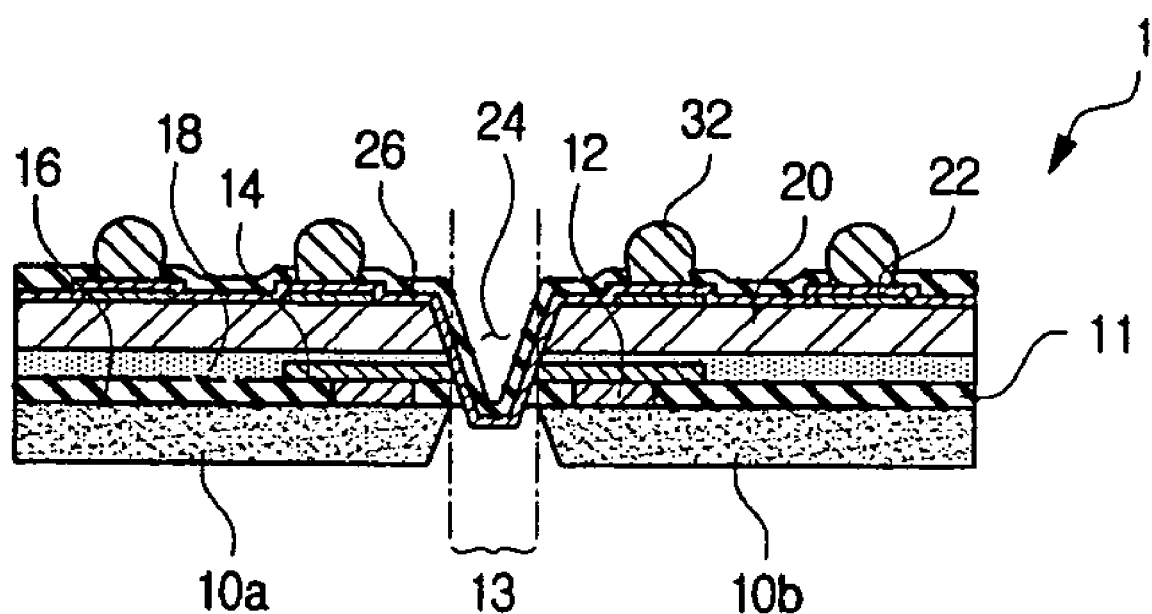
Figure 1J:
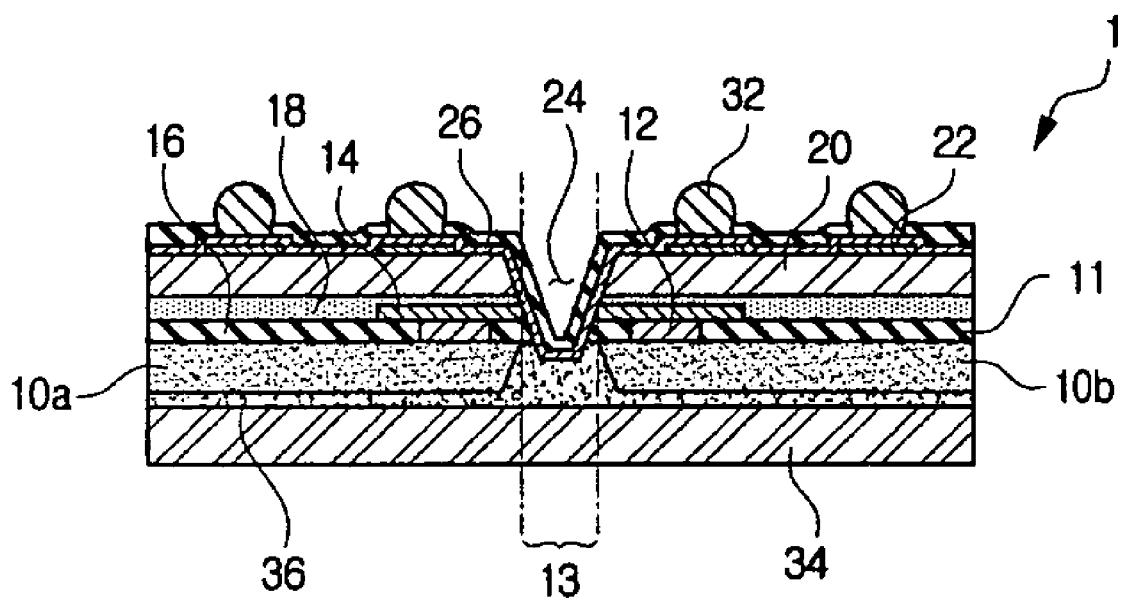
Figure 1K:
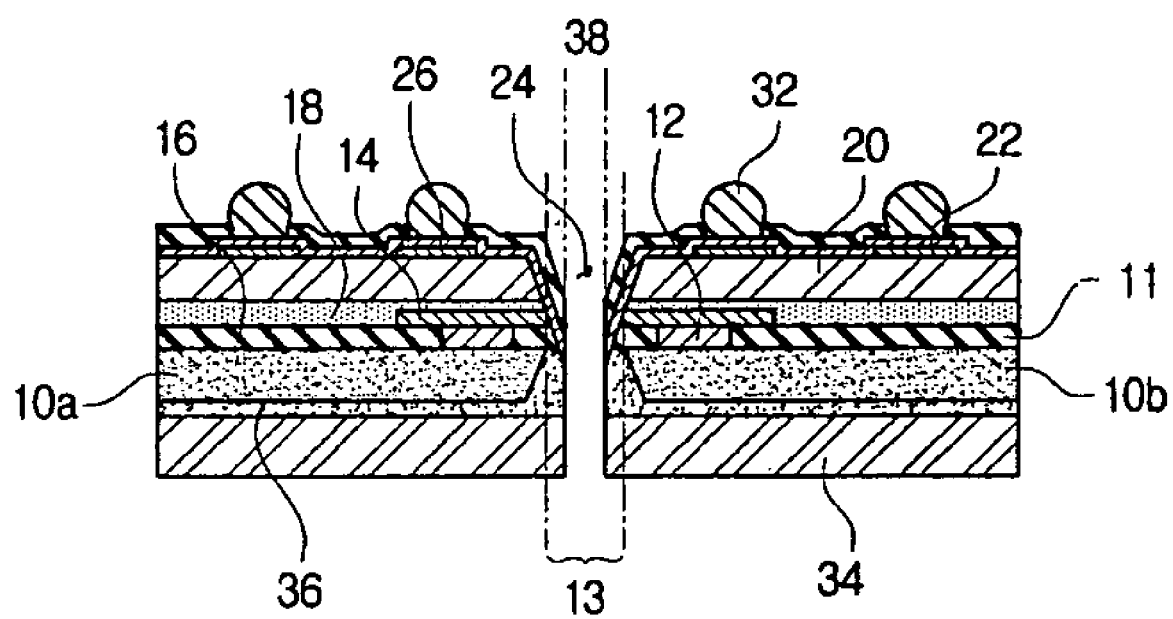

Exemplary, non-limiting embodiments of the present invention will now be described more fully hereinafter with reference to the accompanying drawings. This invention may, however, be embodied in many different forms and should not be construed as limited to the exemplary embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

In is noted that well-known structures and processes are not described or illustrated in detail to avoid obscuring the essence of the present invention. It is also noted that the figures are not drawn to scale. Rather, for simplicity and clarity of illustration, the dimensions of some of the elements are exaggerated relative to other elements. Like reference numerals are used for like and corresponding parts of the various drawings.

Redistribution Substrate

FIGS. 2A to 2D show, in cross-sectional views, a method for producing a redistribution substrate in accordance with one exemplary embodiment of the present invention.

Figure 2A:
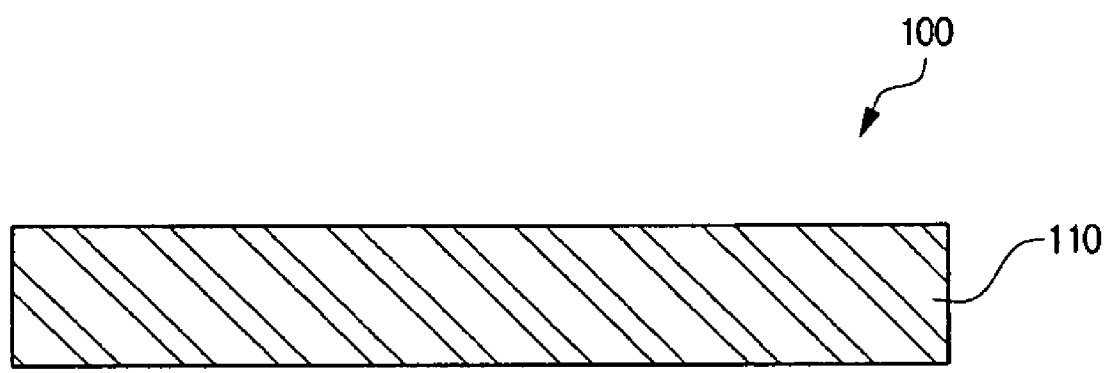
FIGS. 2A to 2D are cross-sectional views showing a method for producing a redistribution substrate in accordance with one exemplary embodiment of the present invention.

FIG. 2A shows a step of providing a transparent insulating substrate 110 as the base of the redistribution substrate 100. The transparent substrate 110 has a thickness of about 300~500 μm and is made of glass, for example. The transparent substrate 110 may be made of alternative materials such as quartz, acrylic resin, and many other suitable materials having good light-transmissivity. Additionally, the transparent substrate 110 may be coated with indium tin oxide (ITO), if necessary.

Figure 2B:
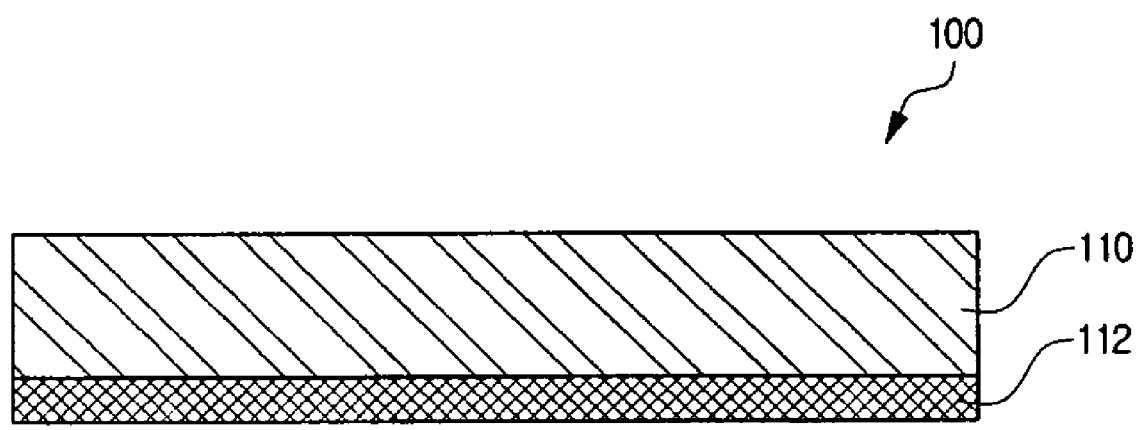

FIG. 2B shows a step of providing an insulating layer 112 on one surface of the transparent substrate 110. The insulating layer 112 has a thickness of about 10~100 μm and will be made into patterned bumps and surrounding dams in a subsequent step. The insulating layer 112 is made of polymer such as polyimide. The material of the insulating layer 112 is however exemplary only, and other suitable materials may be alternatively used as the insulating layer 112.

Figure 2C:
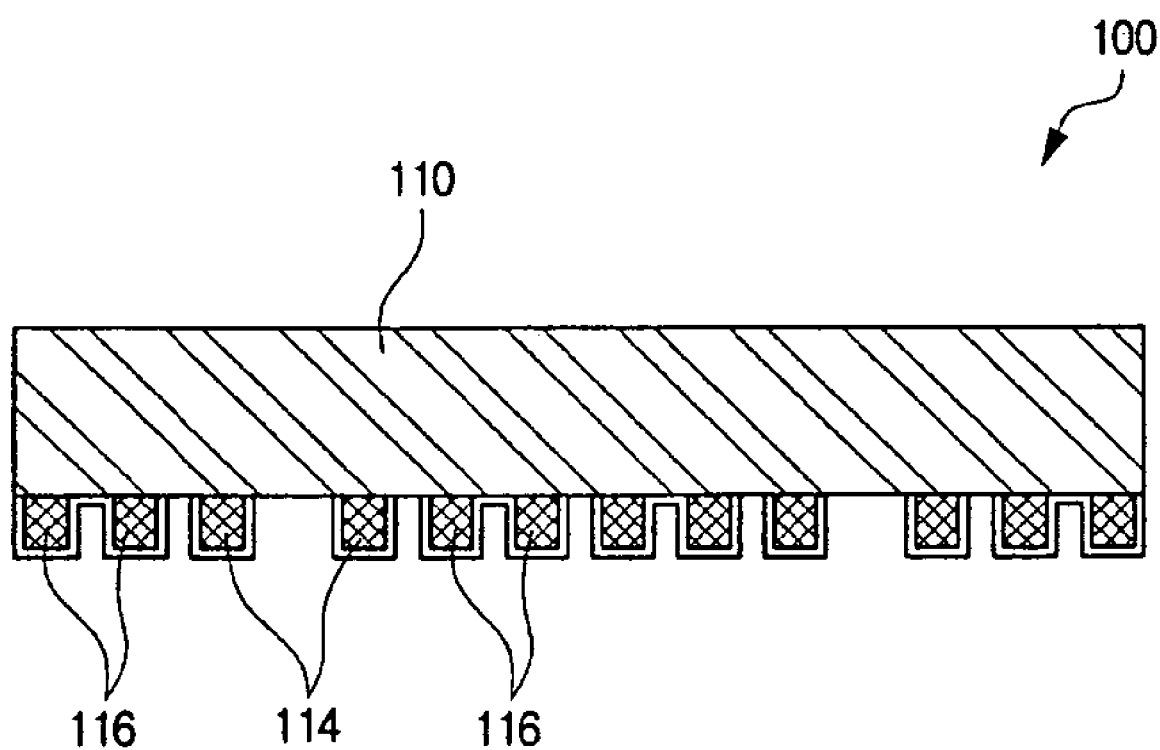

FIG. 2C shows a step of forming the patterned bumps 116 and the surrounding dams 114. The insulating layer 112 is patterned using photo-etching technique well known in this art, so the bumps 116 and the dams 114 are obtained. As described later, the bumps 116 will be in simultaneous contact with both a chip pad and a conductive line of a wafer when the redistribution substrate 100 will be bonded to the wafer. It is therefore desirable that the bumps 116 make pairs.

The wafer level chip scale package of the present invention may be favorably applied to an opto-electronic device such as an image sensor chip, which has an image sensing area composed of a pixel array and a micro lens disposed on a chip active surface. The dam 114 will surround the image sensing area so as to prevent unwanted particles from polluting the image sensing area.

Figure 2D:
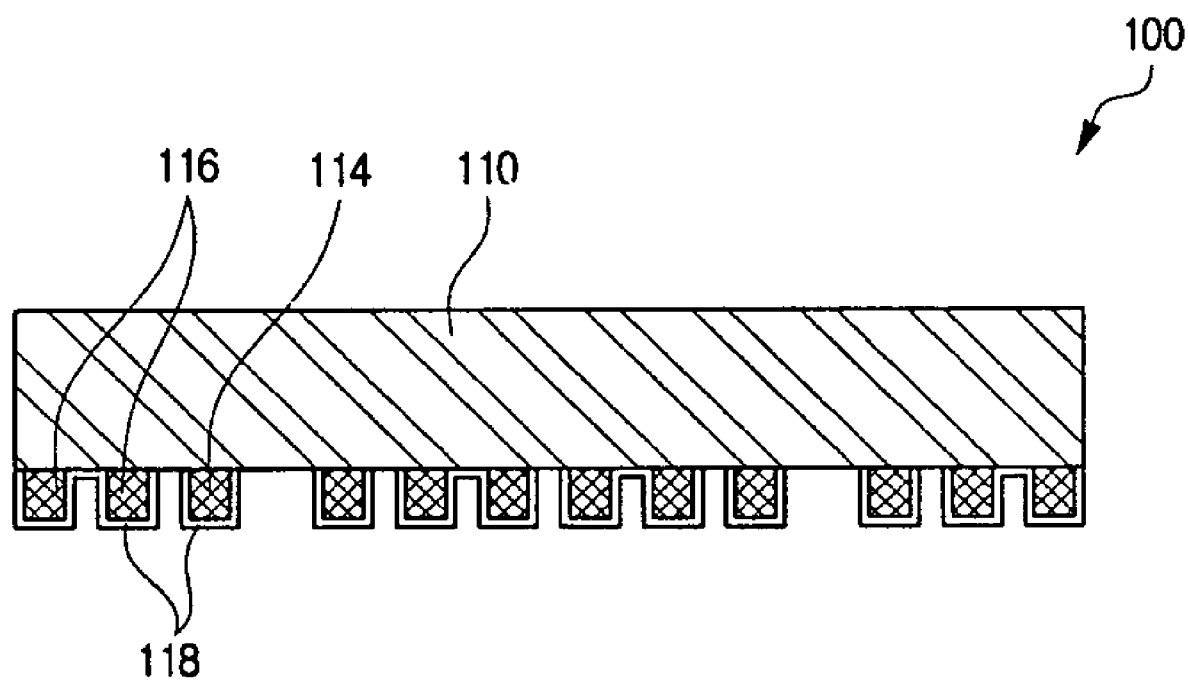

FIG. 2D shows a step of forming redistribution lines 118, each of which connects a pair of bumps 116. If necessary, the redistribution line 118 may be formed on the dam 114. The redistribution lines 118 may be made of copper (Cu), nickel (Ni), titanium (Ti), chromium (Cr), tungsten (W), and their compositions including chromium/copper/titanium (Cr/Cu/Ti), titanium/copper/nickel (Ti/Cu/Ni), chromium/copper/nickel (Cr/Cu/Ni), and titanium/tungsten/nickel (Ti/W/Ni). It will be appreciated, however, that the above list of metals is presented by way of illustration only, and no as a limitation of the invention. Each metal layer may have a thickness ranging from about 50 Å to about 25 µm.

Sputtering or electroplating may be used for forming the redistribution lines 118, and an adequate photoresist mask may be further used for patterning the redistribution lines 118. It will be appreciated that the disclosed techniques are exemplary only and not to be considered as a limitation of the present invention. Many other suitable techniques well known in this art may be alternatively used for forming the redistribution lines 118, for example, deposition, electroless plating, screen printing, and ink printing.

The redistribution substrate 100 discussed hereinbefore will be bonded to the wafer and be used for the manufacture of the wafer level chip scale package.

Wafer

Figure 3:
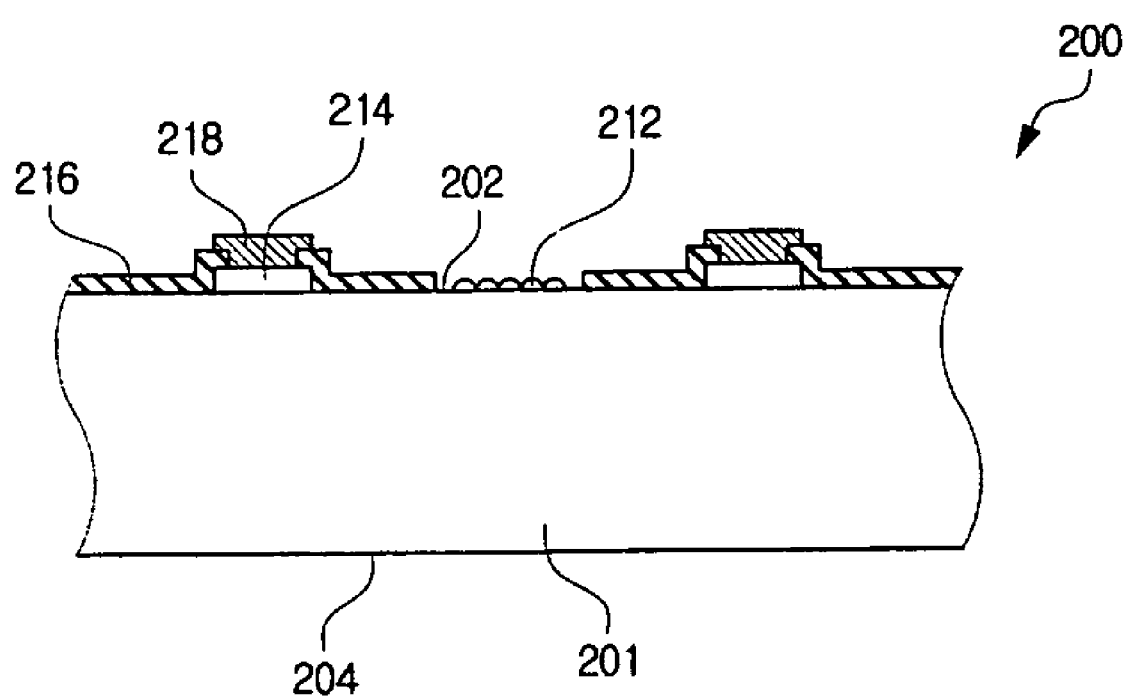
FIG. 3 is a cross-sectional view showing a wafer in accordance with one exemplary embodiment of the present invention.

FIG. 3 shows, in a cross-sectional view; a wafer 200 in accordance with one exemplary embodiment of the present invention.

The wafer is made of semiconductor material such as single crystalline silicon and based on a thin, disc-shaped substrate 201 having a thickness of about 700~800 µm. The semiconductor substrate 201 may have an active surface 202 and a non-active surface 204. Hereinafter the non-active surface 204 will mean the opposing surface to the active surface or otherwise one of side surfaces.

The active surface 202 of the semiconductor substrate 201 has a plurality of chip pads 214 used as electrical connection terminals of chip-internal circuits (not shown). The active surface 202, except for the chip pads 214, is covered with a passivation layer 216. The chip pads 214 are formed of mainly aluminum (Al). The chip pads 214 may be, however, formed of other suitable materials such as alloy of aluminum (Al) and copper (Cu). The passivation layer 216 may be formed of silicon oxide or silicon nitride.

It is desirable that the chip pad 214 is coated with at least one metal layer, which will be hereinafter referred to as a pad metal layer 218. The pad metal layer 218 may be formed of the same metal as used for the above-discussed redistribution layer or otherwise other metals. Preferably, gold (Au), nickel (Ni), aluminum (Al), or copper (Cu) may be used for the pad metal layer 218 and deposited with a thickness of about 1~3 µm. In addition, oxidation-proof metal such as gold (Au) or conductively oxidative metal such as tin (Sn) may be further deposited with a thickness between about 100 Å and about 5 µm. The pad metal layer 218 may be formed using well-known technique, including for example (but not limited to), evaporation or sputter lift-off.

As discussed above, in case of the wafer having opto-electronic devices, the active surface 202 of the semiconductor substrate 201 may also has the image sensing area 212.

The wafer 200 described hereinbefore is bonded to the redistribution substrate, 100 in FIG. 2D, and the wafer level chip scale package is manufactured therefrom.

Wafer Level Chip Scale Package

FIGS. 4A to 4I show, in cross-sectional views, a method for manufacturing a wafer level chip scale package in accordance with one exemplary embodiment of the present invention.

Figure 4A:
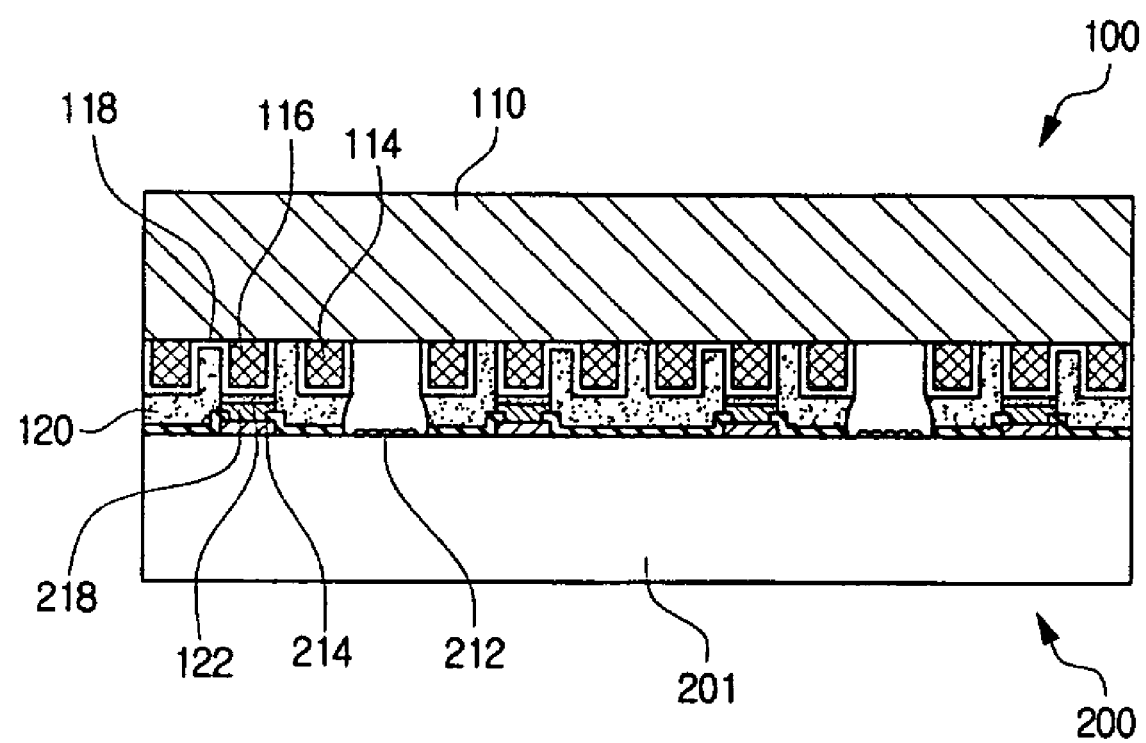
FIGS. 4A to 4I are cross-sectional views showing a method for manufacturing a wafer level chip scale package in accordance with one exemplary embodiment of the present invention.

FIG. 4A shows a step of bonding the redistribution substrate 100 to the wafer 200. This bonding is established using, for example, a photosensitive adhesive 120 such as epoxy. The photosensitive adhesive 120 is selectively coated on the wafer 200 or the redistribution substrate 100 not to cover the image sensing area 212 of the wafer 200. Furthermore, an indium (In)-based adhesive 122 connects the chip pads 214 of the wafer 200 and corresponding ones of the bumps 116 of the redistribution substrate 100 by using laser welding, for example.

In alternative embodiments, the bonding between the redistribution substrate 100 and the wafer 200 may be made using anisotropic conductive material, nano interconnection paste, or any other suitable materials well known in the art.

Figure 4B:
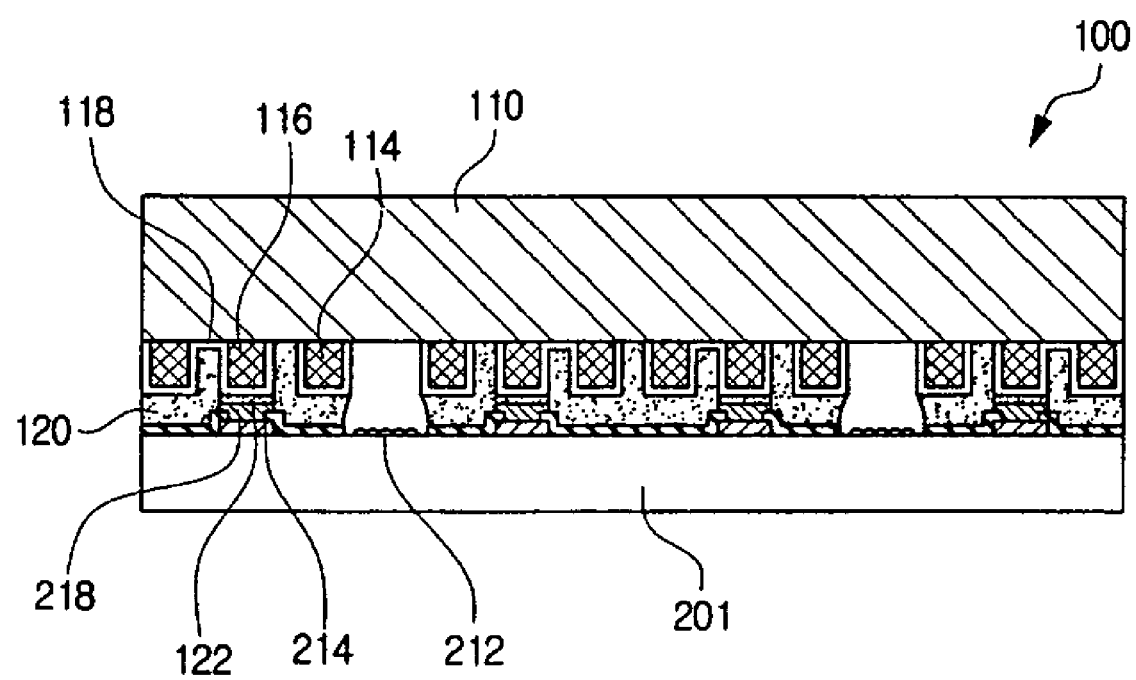

FIG. 4B shows a wafer back-grinding step. After the wafer 200 is bonded to the redistribution substrate 100, the semiconductor substrate 201 may be mechanically grinded, if necessary, so as to reduce the thickness of the wafer 200. The wafer 200 may be thinned down to the thickness of about 50~150 µm by the back grinding step.

Figure 4C:
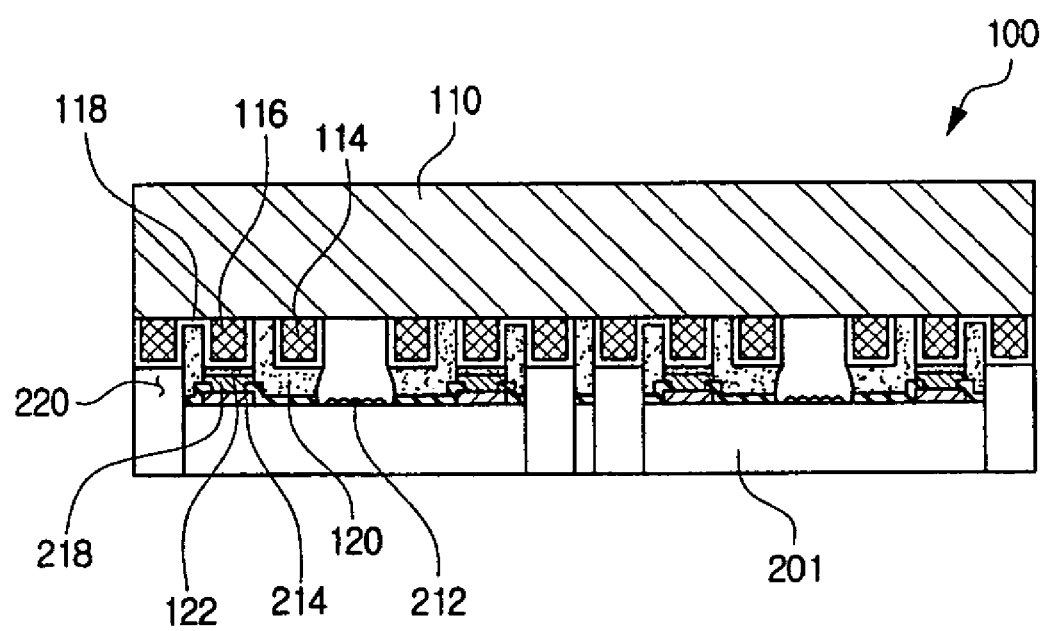

FIG. 4C shows a step of forming holes 220 in the wafer 200. As discussed above, the patterned bumps 116 of the redistribution substrate 100 make pairs. In addition, one of each bump pair comes in contact with the chip pad 214 of the wafer 200. Each hole 220 corresponds to and coincides with the other of each bump pair. The holes 220 may be formed by drilling such as laser drilling or mechanical drilling, etching such as plasma dry etching or reactive ion etching, or any other conventional hole forming technique well known in the art.

Figure 5A:
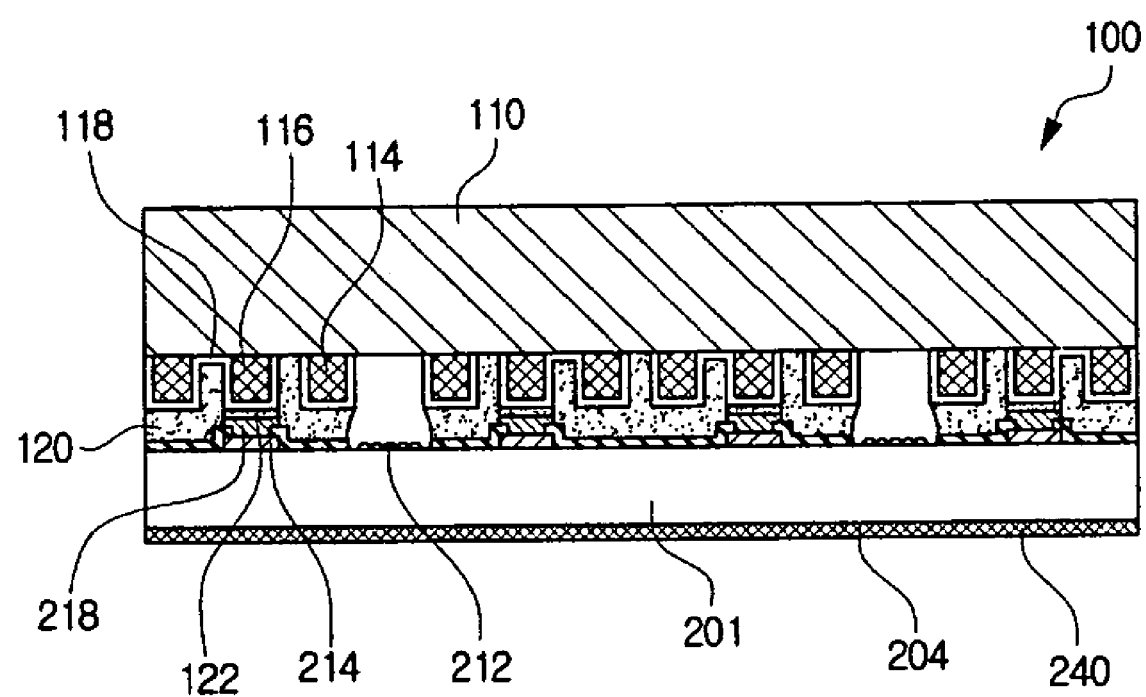
FIGS. 5A to 5E are cross-sectional views showing a method for manufacturing a wafer level chip scale package in accordance with another exemplary embodiment of the present invention.
Figure 5B:
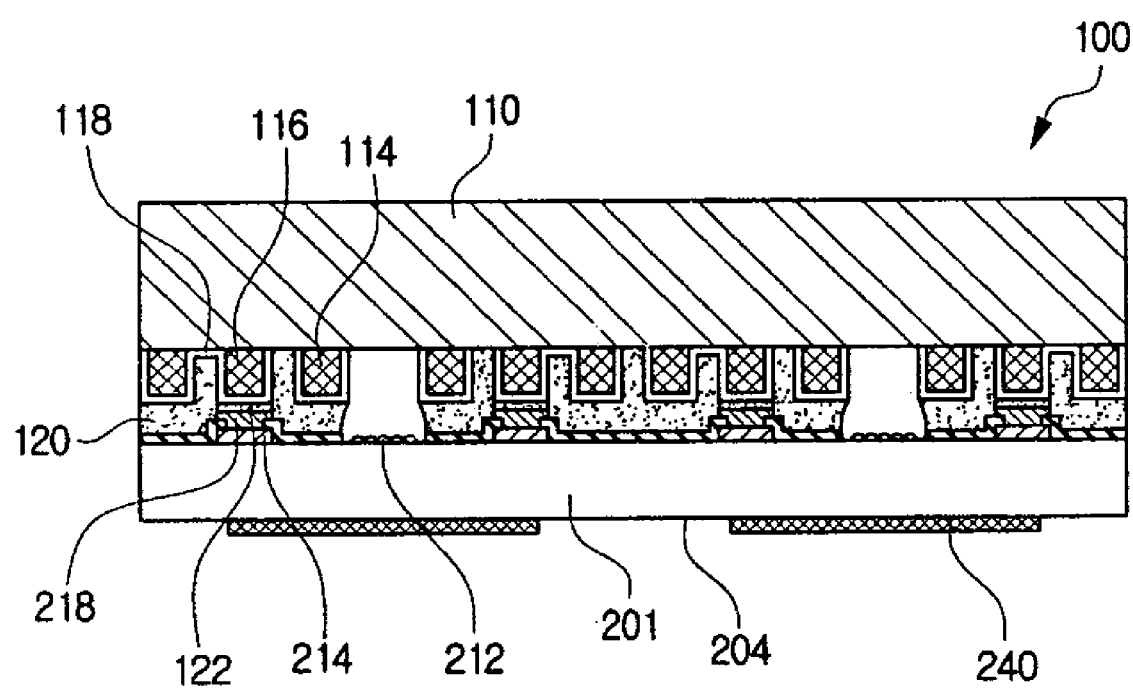
Figure 5C:
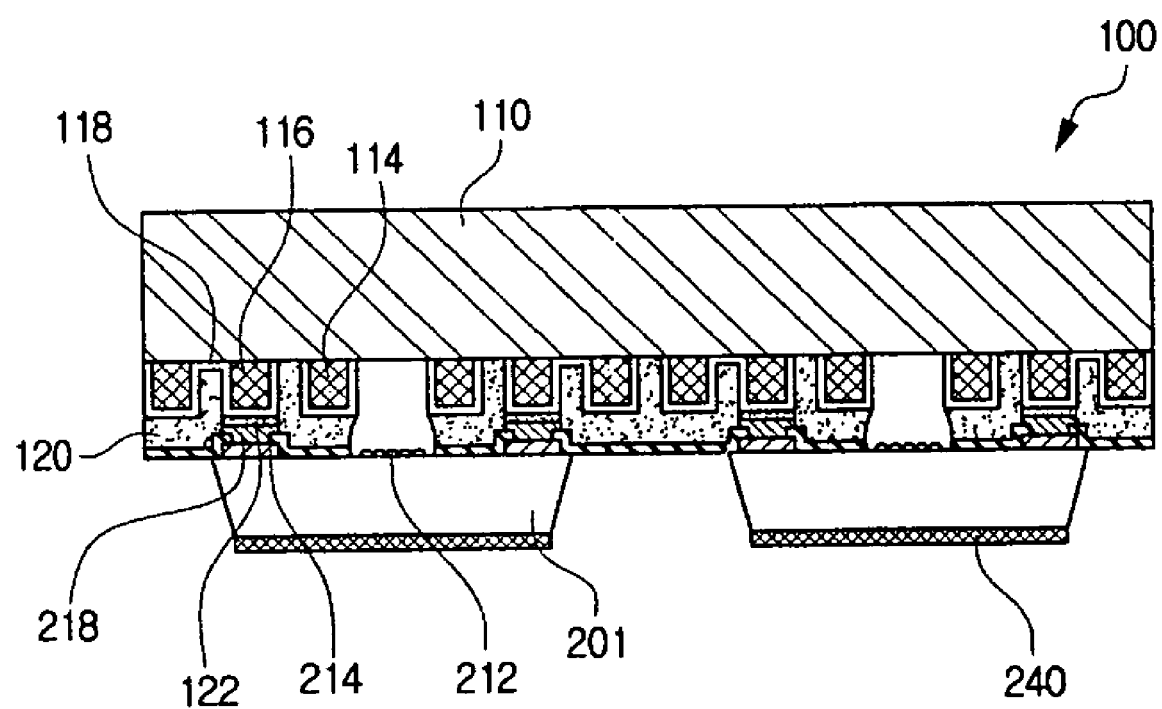
Figure 5D:
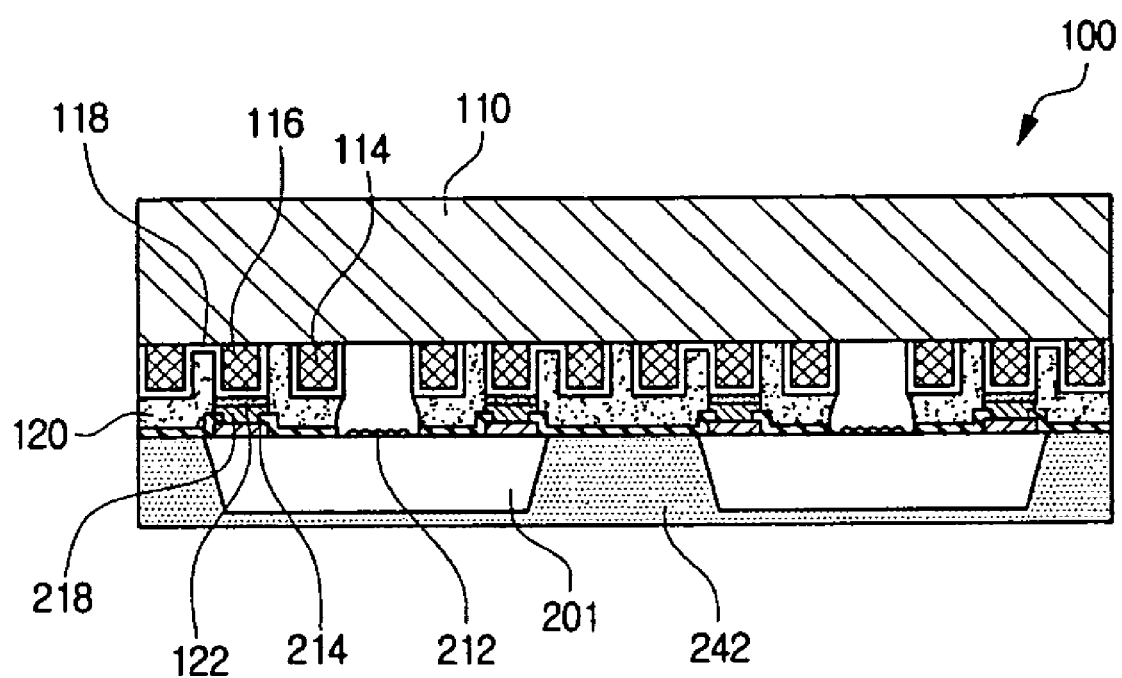
Figure 5E:
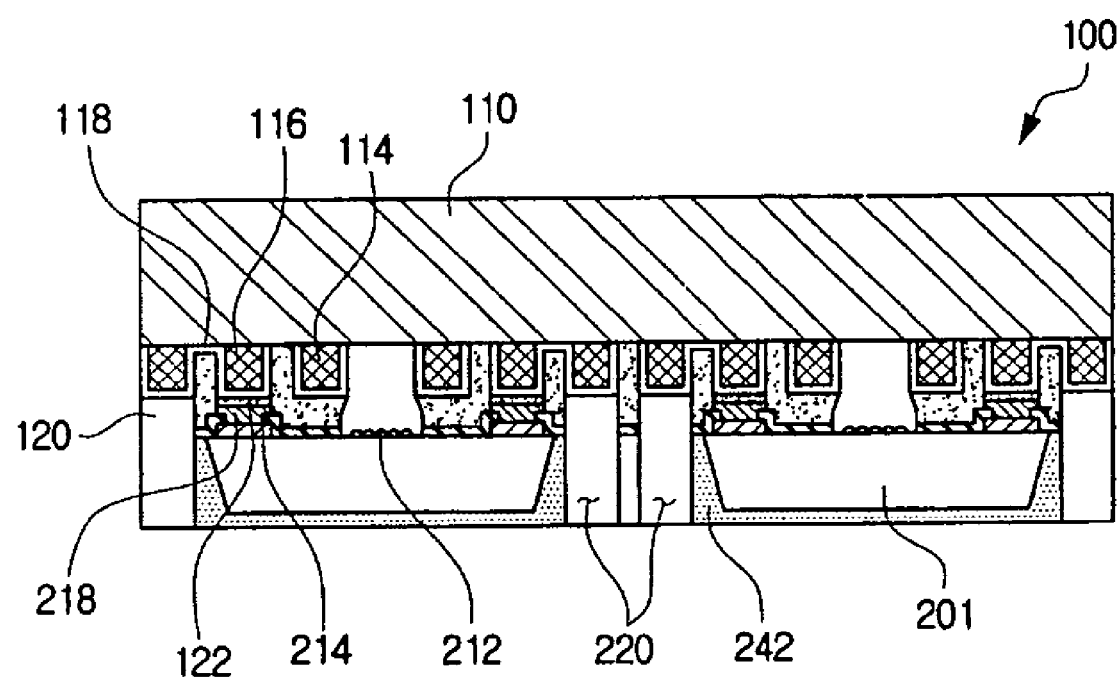

An exemplary case of hole etched is illustrated in FIGS. 5A to 5E. Referring to FIGS. 5A to 5E, at the outset, the bottom surface 204 of the semiconductor substrate 201 is coated with a photoresist layer 240 (FIG. 5A). Next, exposure and development processes are implemented to create a photoresist pattern 241 (FIG. 5B). Then, a plasma etching process is implemented using the photoresist pattern 241 to selectively etch the semiconductor substrate 201 (FIG. 5C). The plasma etching process may use a sulfur hexa fluoride ($SF_6$) gas, for example, as an etchant gas. Thereafter, the photoresist pattern is removed, and the bottom surface 204 of the semiconductor substrate 201 is coated with a thermosetting resin 242 such as epoxy (FIG. 5D). Spin-on or spray technique may be used for coating the thermosetting resin 242. Then, by selectively etching the thermosetting resin 242, the holes 220 are formed in the resin 242 rather than the semiconductor substrate 201 (FIG. 5E).

Figure 4D:
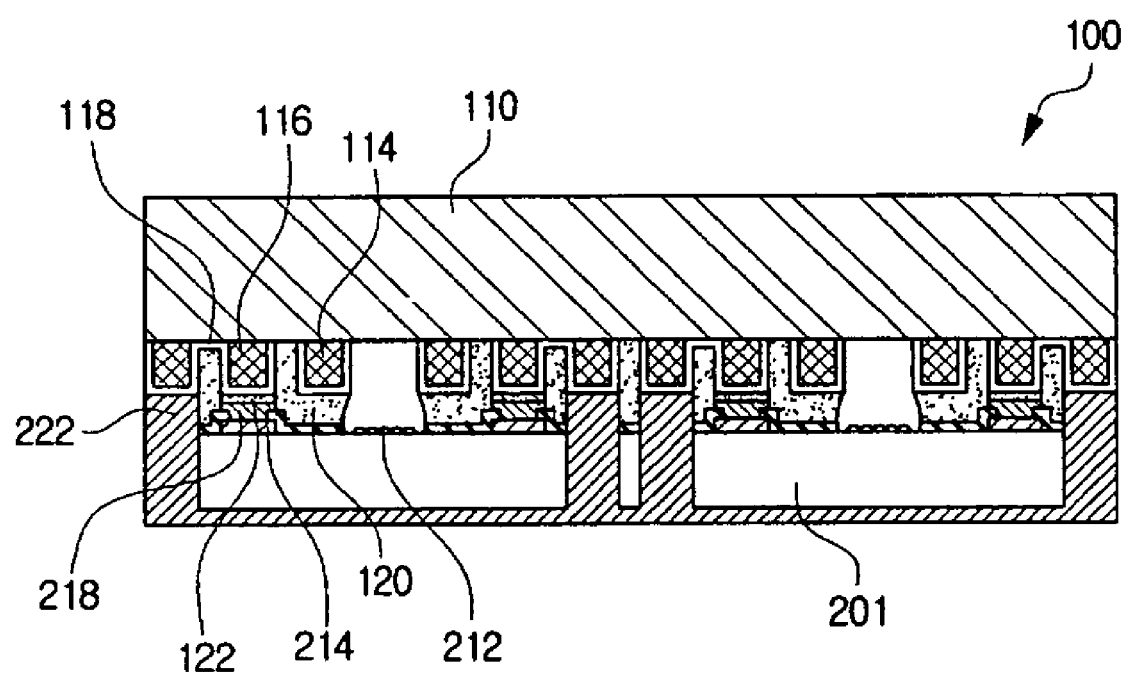

After the holes 220 are formed in the wafer 200, a conductive layer 222 is formed. FIG. 4D shows a step of forming the conductive layer 222 in the holes 220 and on the bottom surface 204 of the semiconductor substrate 201. The conductive layer 222 may be formed of metal or imperfect metal having high conductivity. For example, the conductive layer 222 may employ tungsten (W), titanium (Ti), aluminum (Al), zirconium (Zr), chromium (Cr), copper (Cu), gold (Au), silver (Ag), lead (Pb), nickel (Ni), indium tin oxide (ITO), or their compositions. Preferably, chromium (Cr), copper (Cu) and nickel (Ni) may be electroplated one by one to form the conductive layer 222.

Figure 4E:
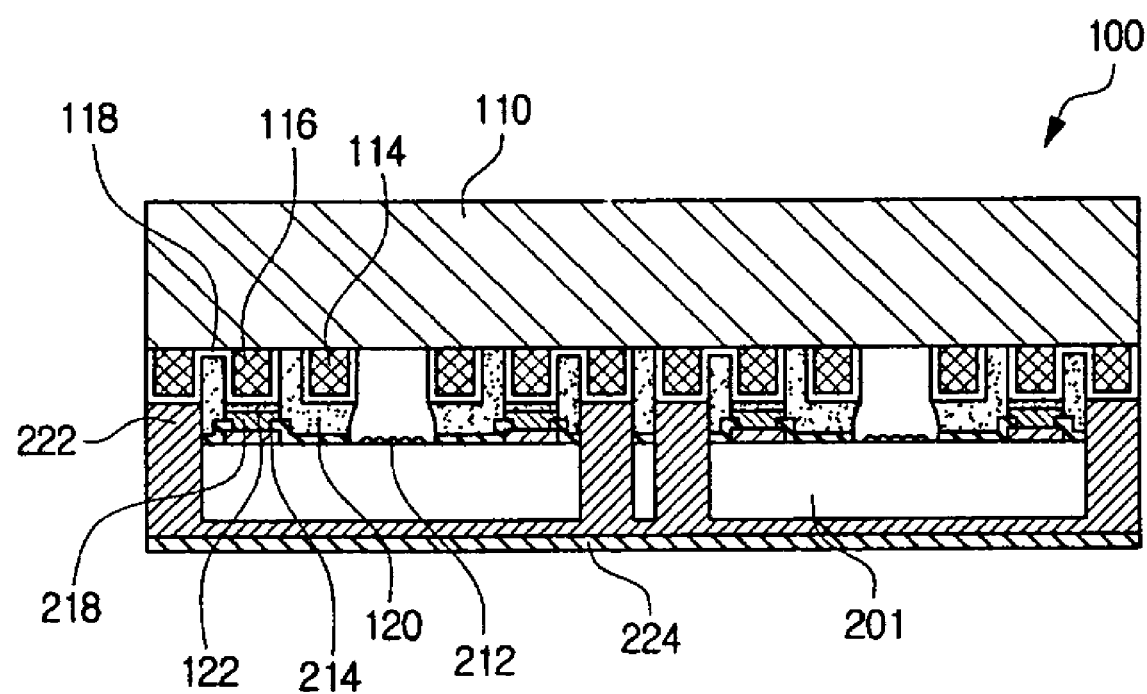

After the formation of the conductive layer 222 (hereinafter referred to as the first conductive layer), a second conductive layer may be further formed, if necessary. FIG. 4E shows a step of forming the second conductive layer 224, which acts as an adhesive layer, a seed layer, a diffusion barrier, and a solder wetting layer. The second conductive layer 224 may be formed of compositions selected among chromium (Cr), titanium (Ti), tungsten (W), copper (Cu), nickel (Ni), gold (Au), and titanium tungsten (TiW). For example, it may be possible to use titanium/copper/nickel/gold (Ti/Cu/Ni/Au), chromium/copper/nickel/gold (Cr/Cu/Ni/Au), or titanium tungsten/nickel (TiW/Ni). It will be appreciated, however, that the above lists of materials for the first and second conductive layers 222 and 224 are presented by way of illustration only, and no as a limitation of the invention.

Figure 4F:
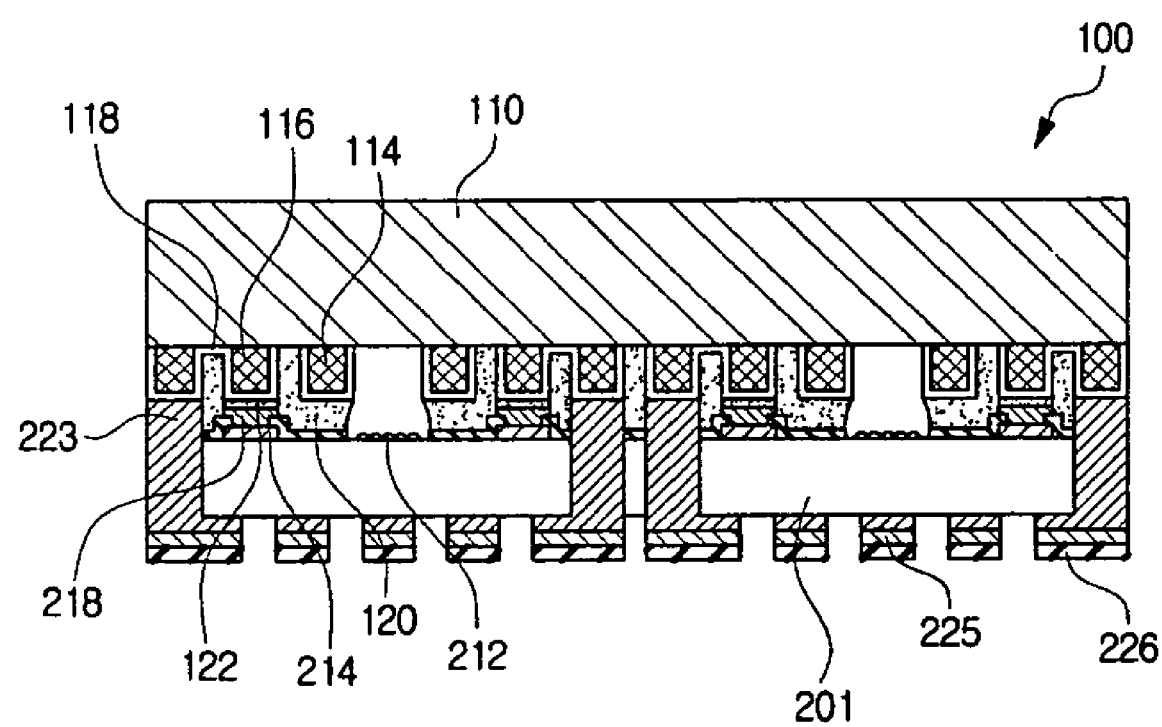

FIG. 4F shows a step of forming first conductive lines 223 and second conductive lines 225, both of which may be created by selectively removing the first and second conductive layers 222 and 224 through a photoresist mask 226. The selective removing of the conductive layers 222 and 224 may use etching or laser trimming well known in the art.

Instead of the selective removing of the conductive layers, conventional pattern plating may be used for forming the conductive lines 223 and 225. The pattern plating includes previously forming a photoresist pattern corresponding to the conductive lines, and then performing a selective electroplating through the photoresist pattern.

Figure 4G:
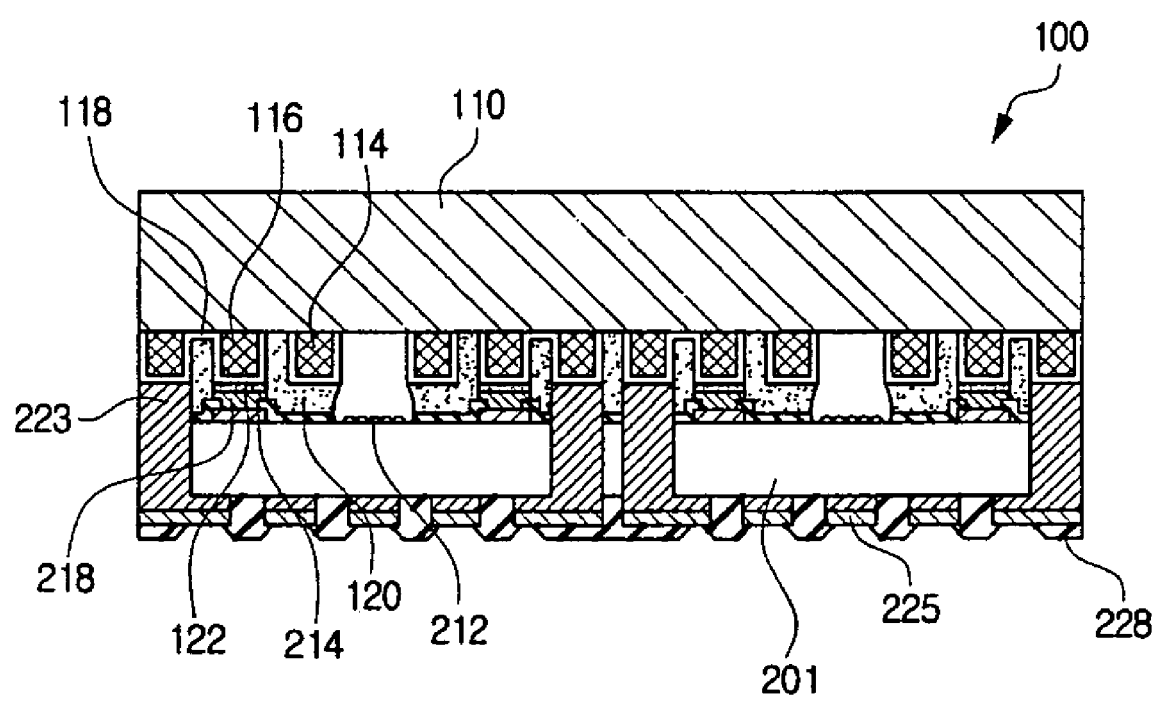

FIG. 4G shows a step of forming a dielectric protective layer 228, which may be made of conventional photo solder resist (PSR) material, for example. The dielectric protective layer 228 not only protects most parts of the conductive lines 223 and 225, but also exposes some parts of the conductive lines 223 and 225 to define terminal locations.

Figure 4H:
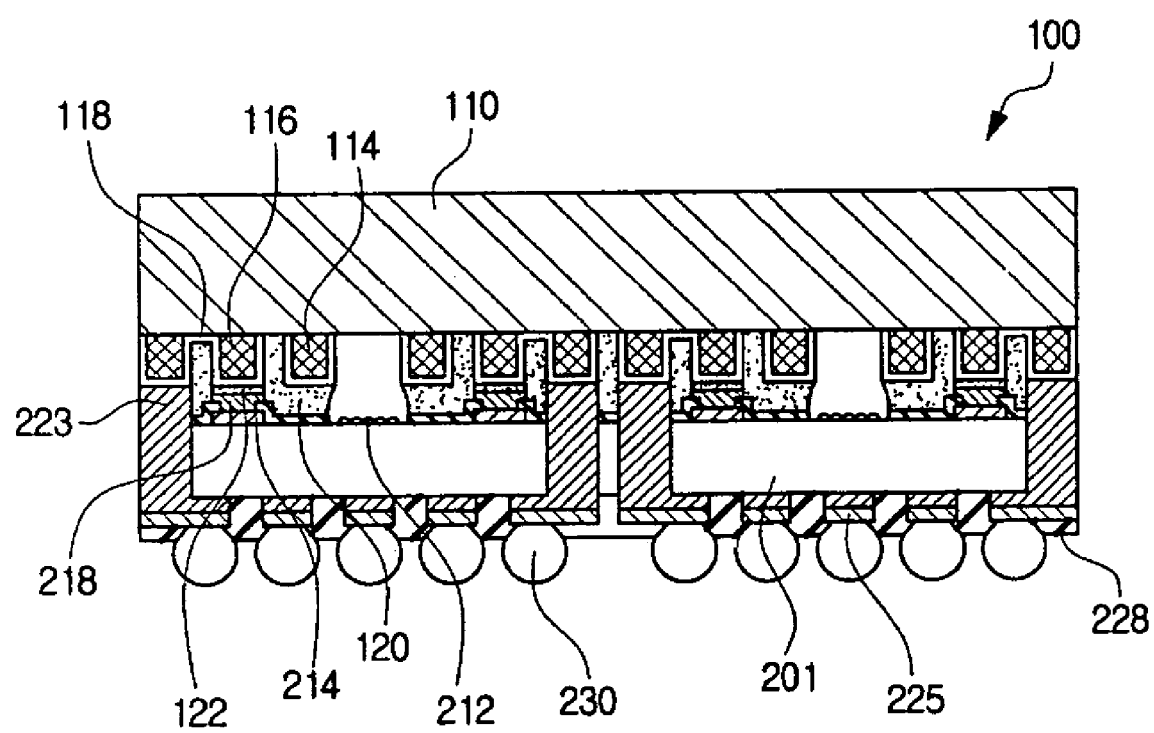

FIG. 4H shows a step of forming external connection terminals 230. Various kinds of solder, gold (Au), or other alternative materials may form the external connection terminals 230 shaped into bumps or balls. The external connection terminals 230 are disposed on the non-active surface of the semiconductor substrate 201. That is, the terminals 230 may be formed on the bottom surface 204 of the semiconductor substrate 201 as depicted, or otherwise on at least one lateral side surface of the semiconductor substrate 201.

Figure 4I:
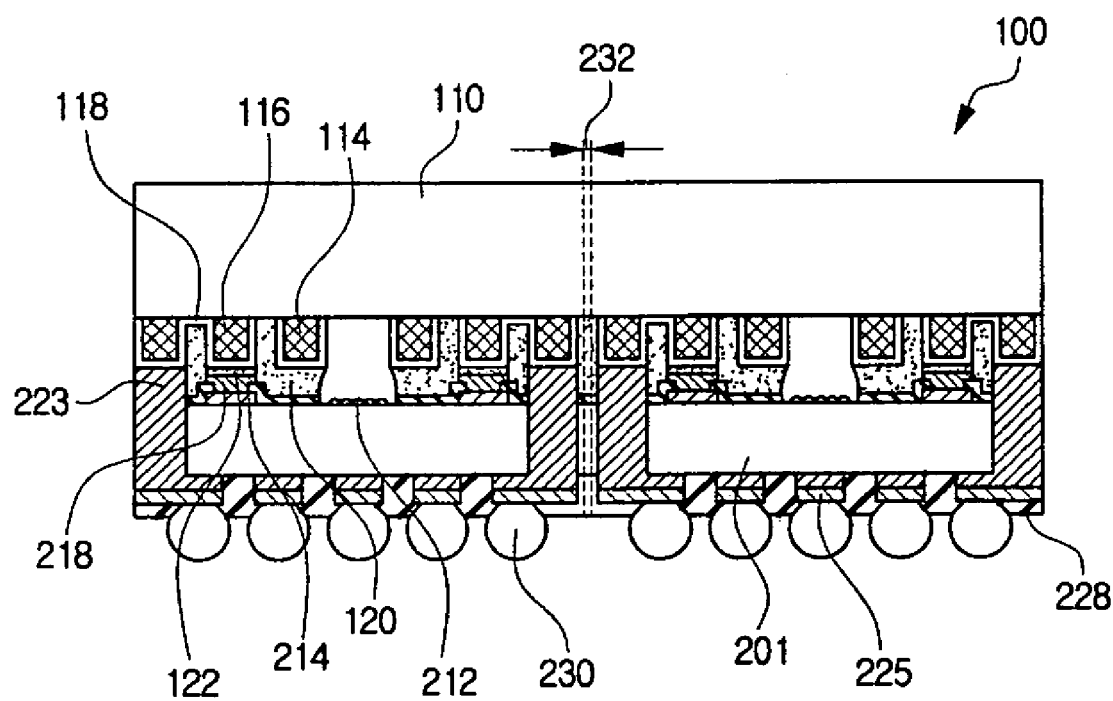

Finally, FIG. 4I shows a wafer-dicing step. The wafer 200 and the redistribution substrate 100 are divided along a scribe region 232, so the WLPs fabricated on the respective chips are obtained. This step may use a diamond wheel or a laser-cutting tool.

As fully discussed hereinbefore, the method according to the present invention uses the redistribution substrate in order to electrically connect the chip pads on the active surface with the package terminals on the non-active surface. The redistribution substrate can be produced separately from the wafer and then bonded to the wafer, so the entire manufacturing process becomes simpler and the productivity becomes improved.

The method of this invention realizes electrical connections by means of the redistribution substrate as well as the holes, both of which are located within the chip region, rather than in the scribe region. It is therefore required neither to increase a scribe region of the wafer nor to use an unfavorable wafer with reduced chip count.

Furthermore, electrical connections using the holes located within the chip region, rather than in the scribe region, are favorable for a reduction in package size.

Moreover, electrical connections using the redistribution lines on the bump pairs offers excellent pattern design flexibility without regard to the locations of the chip pads and the holes.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method for manufacturing a wafer level chip scale package, the method comprising:
   (a) producing a redistribution substrate having a transparent insulating substrate and redistribution lines formed on the transparent insulating substrate;
   (b) providing a wafer having a semiconductor substrate having an active surface and at least one non-active surface, the wafer further having chip pads formed on the active surface;
   (c) bonding the redistribution substrate to the wafer so that first parts of the redistribution lines are connected with the chip pads;
   (d) forming holes extended from the active surface to the non-active surface in the wafer so that the second parts of the redistribution lines are exposed to the holes;
   (e) forming conductive lines in the holes and on the non-active surface;
   (f) forming external connection terminals on the conductive lines formed on the non-active surface; and
   (g) dividing both the redistribution substrate and the wafer along a scribe line.

2. The method of claim 1, wherein the (a) step includes:
   (a-1) providing the transparent insulating substrate;
   (a-2) providing an insulating layer on the transparent insulating substrate;
   (a-3) forming bumps by patterning the insulating layer; and
   (a-4) forming the redistribution lines on the bumps.

3. The method of claim 1, wherein the transparent insulating substrate is made of glass, quartz, or acrylic resin.

4. The method of claim 2, wherein the (a-3) step further includes forming dams by patterning the insulating layer.

5. The method of claim 2, wherein the (a-3) step is forming pairs of bumps, each pair having a first bump connected with the chip pad and a second bump exposed to the hole.

6. The method of claim 2, wherein the insulating layer is made of polymer.

7. The method of claim 1, wherein the redistribution lines are made of materials selected from the group including copper (Cu), nickel (Ni), titanium (Ti), chromium (Cr), tungsten (W), or their compositions.

8. The method of claim 2, wherein the (a-4) step is implemented using techniques selected from the group including sputtering, electroplating, deposition, electroless plating, screen printing, or ink printing.

9. The method of claim 1, wherein the wafer further has an image sensing area formed on the active surface.

10. The method of claim 1, wherein the wafer further has at least one pad metal layer formed on the chip pads.

11. The method of claim 10, wherein the pad metal layer is made of materials selected form the group including gold (Au), nickel (Ni), aluminum (Al), copper (Cu), tin (Sn), or their compositions.

12. The method of claim 1, wherein the bonding between the redistribution substrate and the wafer in the (c) step is established using a photosensitive adhesive.

13. The method of claim 1, wherein the connection between the redistribution lines and the chip pads in the (c) step is made using an indium (In)-based adhesive.

14. The method of claim 1, wherein the bonding between the redistribution substrate and the wafer in the (c) step is made using anisotropic conductive material or nano interconnection paste.

15. The method of claim 1, further comprising:
after the (c) step, mechanically grinding a bottom surface of the wafer so as to reduce the thickness of the wafer.

16. The method of claim 15, wherein the wafer is thinned down to the thickness of about 50~150 μm by the grinding step.

17. The method of claim 1, wherein the (d) step is implemented using techniques selected from the group including laser drilling, mechanical drilling, plasma dry etching, or reactive ion etching.

18. The method of claim 1, wherein the (e) step includes forming at least one conductive layer in the holes and on the non-active surface, and selectively removing the conductive layer so as to create the conductive lines.

19. The method of claim 1, wherein the (e) step includes forming a photoresist pattern corresponding to the conductive lines on the non-active surface, and performing a selective electroplating through the photoresist pattern so as to create the conductive lines.

20. The method of claim 1, wherein the conductive lines has first conductive lines and second conductive lines formed on the first conductive lines.

21. The method of claim 20, wherein the first conductive lines are formed of materials selected from the group including tungsten (W), titanium (Ti), aluminum (Al), zirconium (Zr), chromium (Cr), copper (Cu), gold (Au), silver (Ag), lead (Pb), nickel (Ni), indium tin oxide (ITO), or their compositions.

22. The method of claim 20, wherein the second conductive lines are formed of one composition selected from the group including chromium (Cr), titanium (Ti), tungsten (W), copper (Cu), nickel (Ni), gold (Au), and titanium tungsten (TiW).

23. The method of claim 1, further comprising:
after the (e) step, forming a dielectric protective layer on the conductive lines so as to protect the conductive lines and to define terminal locations.

24. The method of claim 1, wherein the external connection terminals in the (f) step are formed on a bottom surface of the semiconductor substrate, or otherwise on at least one lateral side surface of the semiconductor substrate.

* * * * *